United States Patent
Cho et al.

(10) Patent No.: US 7,134,063 B2
(45) Date of Patent: Nov. 7, 2006

(54) APPARATUS AND METHOD FOR TESTING ON-CHIP ROM

(75) Inventors: Sang-yeun Cho, Seoul (KR); Yong-chun Kim, Yongin (KR)

(73) Assignee: Samsung Electronics, Co., Ltd. (KR)

( * ) Notice: Subject to any disclaimer, the term of this patent is extended or adjusted under 35 U.S.C. 154(b) by 424 days.

(21) Appl. No.: 10/460,284

(22) Filed: Jun. 12, 2003

(65) Prior Publication Data
US 2004/0006730 A1     Jan. 8, 2004

(30) Foreign Application Priority Data
Jul. 8, 2002     (KR) ............................ 2002-39426

(51) Int. Cl.
*G01R 31/28* (2006.01)
*G11C 7/00* (2006.01)

(52) U.S. Cl. .............. 714/733; 365/201; 714/719; 714/733; 714/30

(58) Field of Classification Search ............. None
See application file for complete search history.

(56) References Cited

U.S. PATENT DOCUMENTS

| | | | | |
|---|---|---|---|---|
| 6,081,908 A * | 6/2000 | Yamada | ........... | 714/30 |
| 6,396,753 B1 * | 5/2002 | Hung et al. | ........... | 365/201 |
| 6,550,023 B1 * | 4/2003 | Brauch et al. | ........... | 714/42 |
| 6,633,999 B1 * | 10/2003 | Lee | ........... | 714/30 |
| 6,876,591 B1 * | 4/2005 | Gappisch et al. | ........... | 365/201 |
| 6,957,371 B1 * | 10/2005 | Ricchetti et al. | ........... | 714/733 |
| 2002/0018380 A1 * | 2/2002 | Shinmori | ........... | 365/200 |
| 2003/0065931 A1 * | 4/2003 | Nakai et al. | ........... | 713/193 |
| 2003/0120941 A1 * | 6/2003 | Bae | ........... | 713/193 |
| 2004/0049724 A1 * | 3/2004 | Bill et al. | ........... | 714/733 |
| 2004/0193984 A1 * | 9/2004 | Soundron | ........... | 714/733 |
| 2004/0230870 A1 * | 11/2004 | Wang et al. | ........... | 714/30 |

OTHER PUBLICATIONS

Yeh et al., "Flash Memory Built-in Self-test Using March-like Algorithms", Jan. 29-31, 2002, IEEE Workshop on Electronic Design, Test and Application 2002, pp. 137-141.*
Van Wauwe et al., "A Cost Effective Way to Test Embedded RAM and ROM", Sep. 17-21, 1990, IEEE ASIC Seminar and Exhibit, 1990, pp. 14/8.1-14/8.4.*

* cited by examiner

*Primary Examiner*—Guy Lamarre
*Assistant Examiner*—John P. Trimmings
(74) *Attorney, Agent, or Firm*—Mills & Onello LLP

(57) ABSTRACT

An apparatus for testing an on-chip ROM and a method thereof are provided. By embedding the on-chip ROM test apparatus in a semiconductor chip and externally providing only minimal information, the apparatus and the method can prevent the possible exposure of ROM data stored in the ROM. Also, according to the apparatus and method, information related to the ROM address at which an error occurred can be provided together with the test result and by feeding the ROM address information back to the manufacturing process, product yield can be improved.

27 Claims, 7 Drawing Sheets

APPARATUS AND METHOD FOR TESTING ON-CHIP ROM

This application claims priority from Korean Patent Application No. 02-39426, filed on Jul. 8, 2002, in the Korean Intellectual Property Office, the contents of which are incorporated herein by reference in their entirety.

BACKGROUND OF THE INVENTION

1. Field of the Invention

The present invention relates to a read only memory (ROM), and more particularly, to an apparatus for testing an on-chip ROM and a method thereof by which the contents stored in a ROM are tested within the chip, without being transferred externally, and only information as to whether or not there is a defect is output, such that the digital content of the ROM is protected.

2. Description of the Related Art

Contemporary microprocessors may include a ROM embedded therein as needed. For example, code that is executed during initialization, or "boot-up" of a processor, or code that is part of a subroutine that is frequently used in the system, may be stored in a ROM. Thus, during the manufacture of a microprocessor including a ROM that stores predetermined digital content, there is a test process for testing whether the content stored in the ROM is properly programmed.

In conventional systems, in order to test a ROM embedded in a chip (hereinafter referred to as an on-chip ROM), the chip mode of operation is set to a ROM test mode, a ROM test module within the chip exports the ROM data programmed in the ROM to an external test apparatus, and the external test apparatus compares the contents. Thus, the conventional approach, in which the ROM data stored in the on-chip ROM is read by the external test apparatus and it is determined whether or not there is an error, is relatively easy to implement and intuitive. However, the ROM data programmed in the on-chip ROM can be readily accessed during test mode. Thus, the conventional approach does not allow for the protection of digital content stored in the on-chip ROM in the case where it is desired that such content not be exposed to others.

SUMMARY OF THE INVENTION

The present invention provides an apparatus and method for internally testing an on-chip ROM in a chip without the need for externally exporting the contents of the on-chip ROM.

The present invention also provides a computer readable medium having embodied thereon a computer readable program code for the method for testing an on-chip ROM.

The present invention also provides a semiconductor apparatus which, by itself, tests an internal ROM and provides an external indication of only information as to whether or not there is an error in the ROM data.

According to an aspect of the present invention, there is provided an on-chip ROM test apparatus which internally tests a ROM integrated into a semiconductor chip, the on-chip ROM test apparatus comprising a test control signal generator which, by using external test signals, the test signals including a test mode signal that sets the mode of the ROM to a test mode, a test clock signal which generates a clock used in testing the ROM, and a test reset signal for initialization, generates a ROM clock signal to operate the ROM and test control signals including a ROM address to access the ROM; a comparator which compares ROM data read from the ROM in response to the ROM address with external reference data; and a test result accumulator which, in response to the comparison result, stores information related to whether an error occurred, as a test result.

In one embodiment, if the comparison of the ROM data is performed to the last ROM address, the test result is externally output.

According to another aspect of the present invention, there is provided an on-chip ROM test method in which a ROM embedded in a semiconductor chip is tested internally in the semiconductor chip, the on-chip ROM test method comprising (a) in response to external test signals, generating a ROM clock signal to operate the ROM and test control signals including a ROM address to access the ROM; (b) comparing ROM data read from the ROM in response to the ROM address with external reference data and detecting the occurrence of an error in the ROM data; and (c) if the comparison of the ROM data is performed to the last ROM address in step (b), externally outputting information as to whether at least one error occurred in the ROM data, as a test result.

According to still another aspect of the present invention, there is provided a semiconductor apparatus comprising a ROM in which ROM data is programmed; a ROM control unit which generates a ROM control signal to control a normal operation of the ROM; a ROM test apparatus which, by using external test signals, including a test mode signal that sets the mode of the ROM to a test mode, generates a ROM clock signal to operate the ROM and test control signals including a ROM address to access the ROM, and carries out a test to determine whether an error occurred in ROM data by comparing ROM data read from the ROM in response to the ROM address with external reference data, and a selector which, in response to the test mode signal, selectively provides any one of the ROM control signal and the test control signal to the ROM.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS

Figure 1:
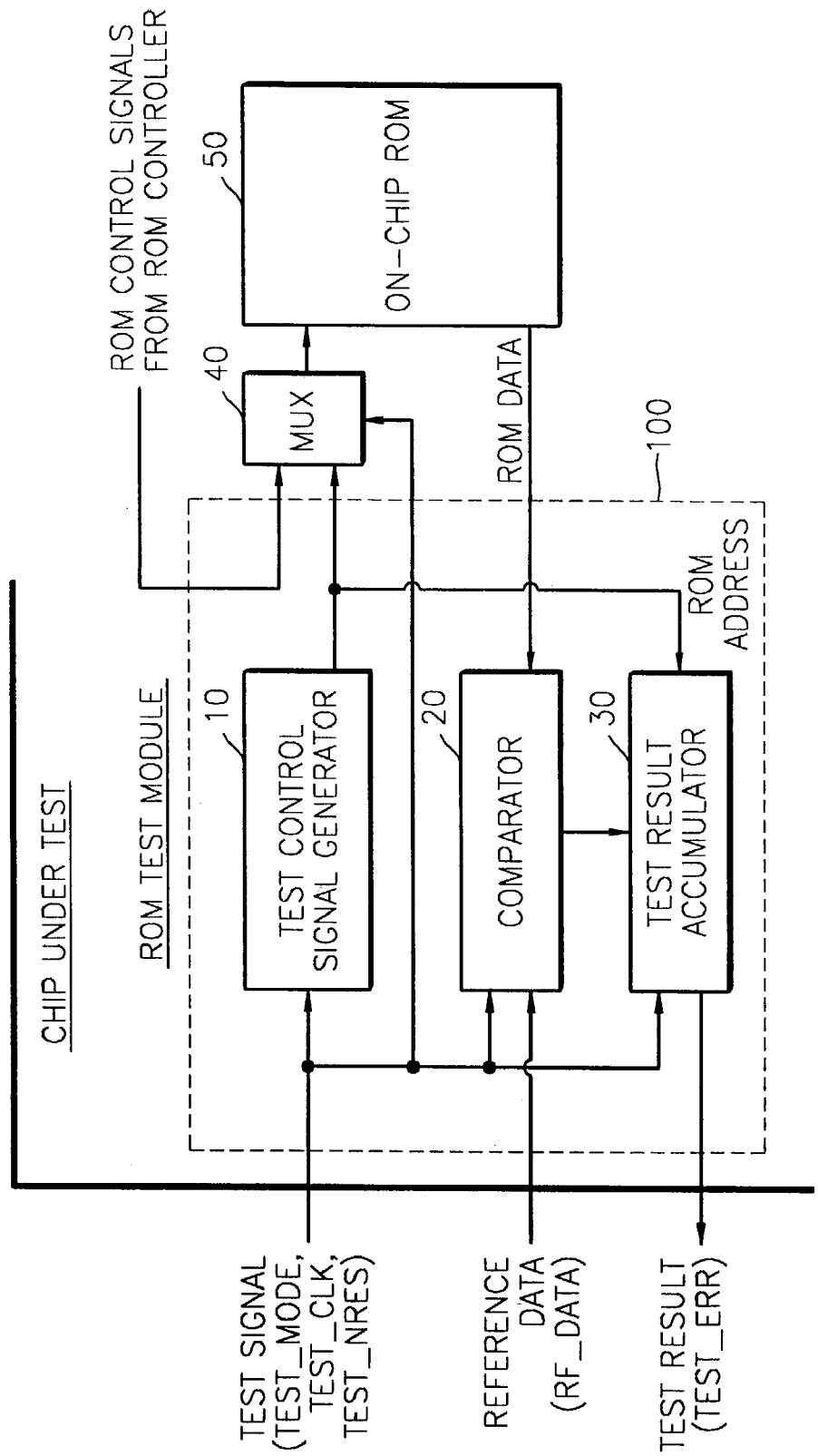
FIG. 1 is a schematic block diagram illustrating an apparatus for testing an on-chip ROM according to the present invention.

FIG. 1 is a schematic block diagram illustrating an apparatus for testing an on-chip ROM according to the present invention. Referring to FIG. 1, an on-chip ROM test apparatus 100 according to the present invention comprises a test control signal generator 10, a comparator 20, and a test result accumulator 30. For convenience of explanation, FIG. 1 shows an on-chip ROM 50 for which a test is desired, together with a selector 40. The on-chip ROM test apparatus 100 and the on-chip ROM 50 are, for example, formed in the same semiconductor chip. The on-chip ROM test apparatus 100, in response to external control, tests the on-chip ROM 50 inside the semiconductor chip and externally provides the test result.

Referring to FIG. 1, using test signals input from an external source, the on-chip ROM test apparatus 100 generates a ROM clock signal to operate the on-chip ROM 50 and test control signals including a ROM address to access the on-chip ROM 50. Here, the test signals include a test mode signal (TEST_MODE) for setting the on-chip ROM to a test mode, a test clock signal (TEST_CLK) for generating a clock required for testing the on-chip ROM 50, and a test reset signal (TEST_NRES) for initializing the on-chip ROM test apparatus 100. By comparing ROM data read in response to a ROM address with reference data (RF_DATA) input from an external source, the on-chip ROM test apparatus 100 detects whether or not an error exists in the ROM data and externally provides the result as the test result (TEST_ERR).

The selector 40, in response to a test mode signal (TEST_MODE), selectively provides either a ROM control signal generated by a ROM controller (not shown) which controls the operation of the on-chip ROM 50 or the test control signal generated by the on-chip ROM test apparatus 100, to the on-chip ROM 50. That is, if the test mode signal (TEST_MODE) is enabled, the semiconductor chip under test is in a mode for testing the on-chip ROM 50 and the selector 40 therefore provides a test control signal generated by the on-chip ROM test apparatus 100 to the on-chip ROM 50. Meanwhile, if the test mode signal (TEST_MODE) is disabled, the semiconductor chip returns to a normal operation mode and the selector 40 provides a ROM control signal generated by the ROM controller (not shown) to the on-chip ROM 50 for a normal operation.

Referring to FIG. 1, the on-chip ROM test apparatus 100 according to the present invention will now be explained in detail.

Referring to FIG. 1, using the externally provided test signals (TEST_MODE, TEST_CLK, TEST_NRES), the test control signal generator 10 generates a ROM clock signal to operate the on-chip ROM 50 and test control signals including a ROM address to access the on-chip ROM 50. Here, if the test clock signal (TEST_CLK) is the same as the operation frequency of the ROM, the test control signal generator 10 does not need to generate a separate ROM clock signal and can use the test clock signal (TEST_CLK) as a ROM clock signal. Hereinafter, for convenience of explanation, it is assumed that the frequency of the test clock signal (TEST_CLK) is the same as the operation frequency of the ROM. The test control signal generator 10 will be explained in detail below with reference to FIG. 4.

The comparator 20 compares ROM data read from the on-chip ROM 50 in response to a ROM address, with externally-provided reference data (RF_DATA), and outputs the comparison result to the test result accumulator 30. The comparator 20 will be explained in detail below with reference to FIG. 5.

The test result accumulator 30 stores information as to whether an error exists in the ROM data, by referring to the comparison result in the comparator 20, of the ROM data with the reference data (RF_DATA). Then, if it is confirmed that the comparator 20 has finished comparison of ROM data to the last ROM address, information as to whether an error exists in the ROM data is externally output as a test result. At this time, the test result accumulator 30 receives a ROM address from the test control signal generator 10, and if it is determined that an error exists in the ROM data by referring to the comparison result of the comparator 20, the accumulator 30 stores the ROM address corresponding to the ROM data where the error exists. Also, when the test result (TEST_ERR) is provided, ROM address information as to where the error occurred can also be provided. In order to minimize the number of pins allocated for a test in a semiconductor chip, it is desirable that the test result and information as to the ROM address where the error occurred are output as serial data. That is, the test result accumulator 30 is designed so that the test result and information as to the ROM address where the error occurred can be output through a single pin. The test result accumulator 30 will be explained in detail below with reference to FIGS. 6 and 7.

Figure 2:
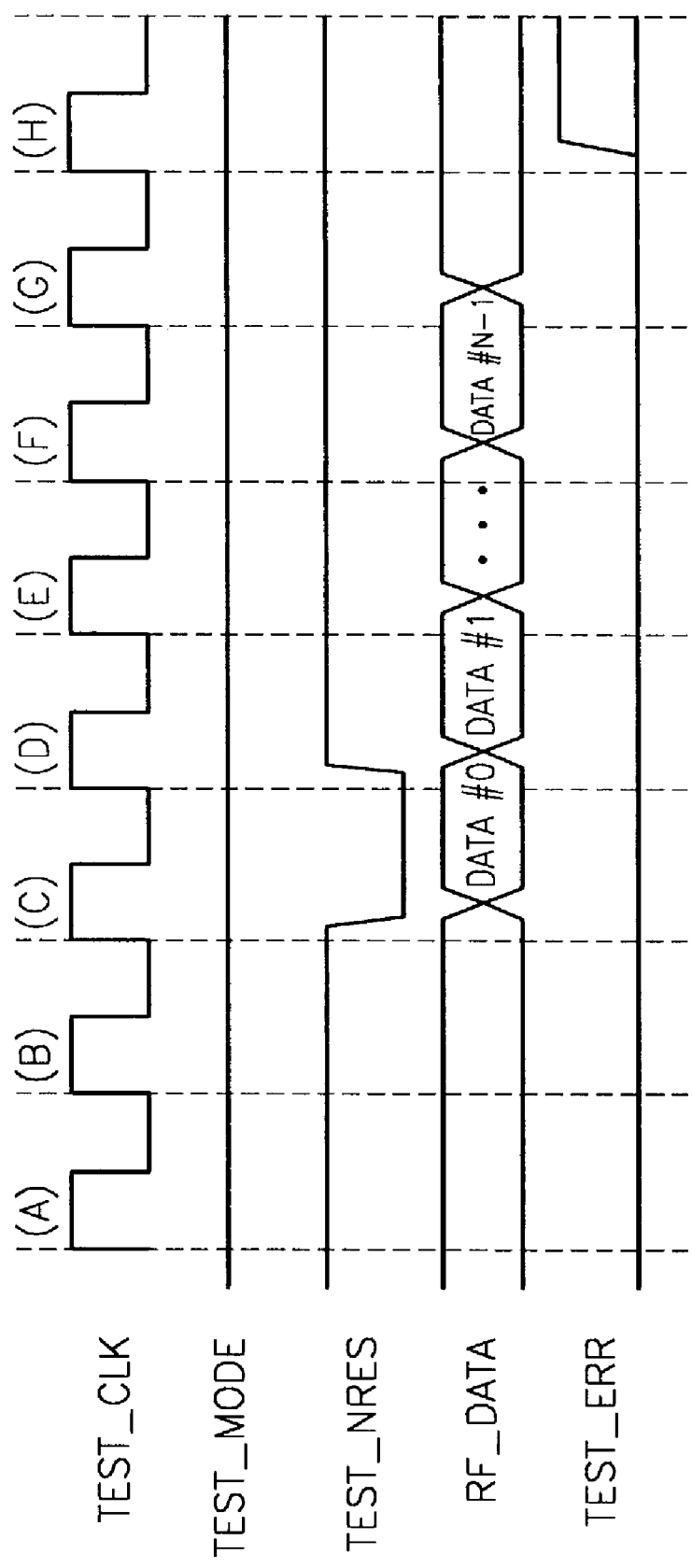
FIG. 2 is a waveform diagram illustrating input/output waveforms of the on-chip ROM test apparatus shown in FIG. 1.
Figure 3:
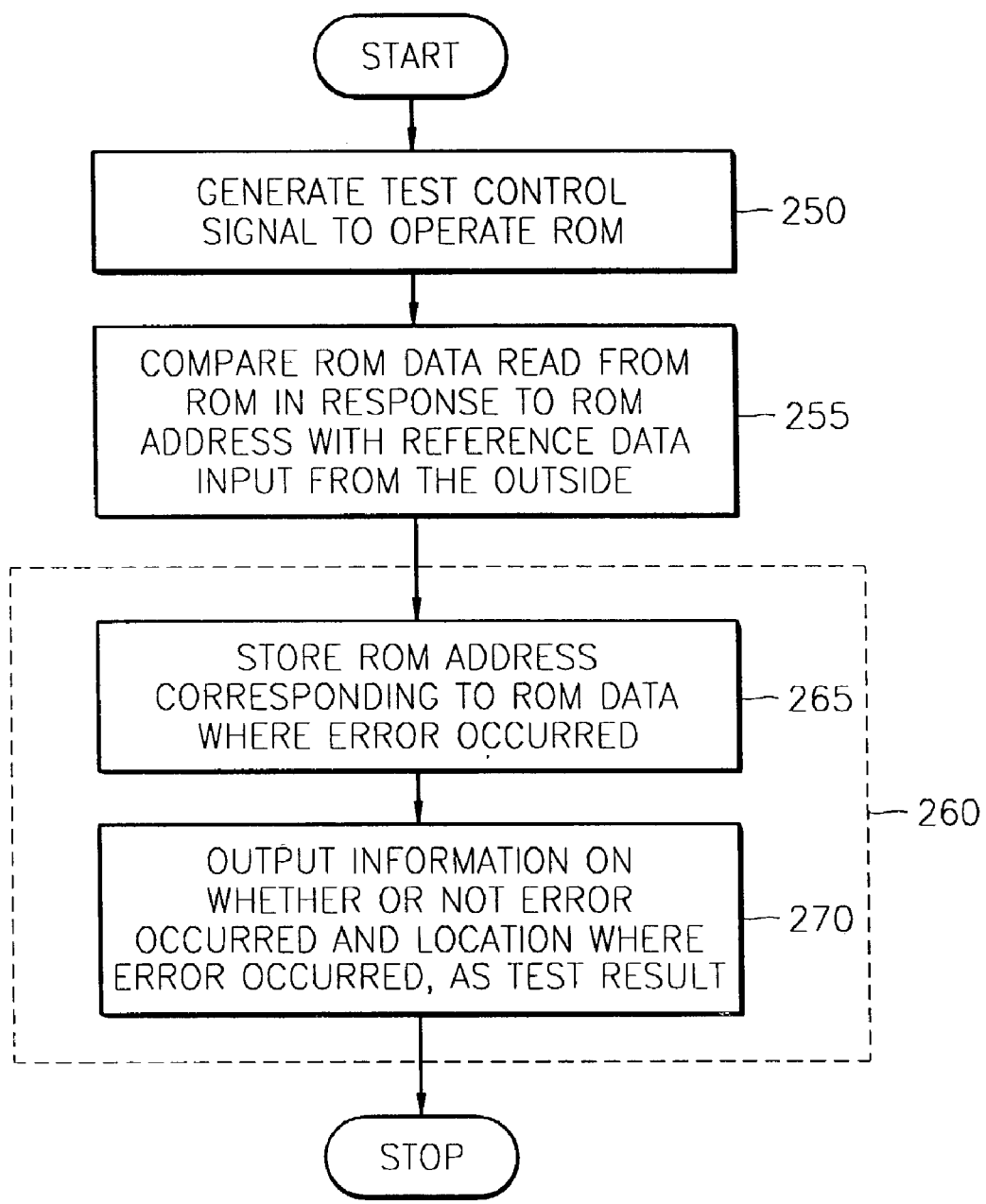
FIG. 3 is a flowchart showing a method for testing an on-chip ROM performed in the on-chip ROM test apparatus shown in FIG. 1.

FIG. 2 is a waveform diagram of input/output waveforms of the on-chip ROM test apparatus 100 shown in FIG. 1. FIG. 3 is a flowchart of a method for testing an on-chip ROM performed using the on-chip ROM test apparatus 100 shown in FIG. 1.

Referring to FIGS. 1 through 3, the operation of the on-chip ROM test apparatus shown in FIG. 1 will now be explained in detail.

First, test signals including a test clock signal (TEST_CLK), a test mode signal (TEST_MODE), and a test reset signal (TEST_NRES), and reference data (RF_DATA) to be compared with ROM data, as shown in FIG. 2, are provided to the on-chip ROM test apparatus 100. Then, the on-chip ROM test apparatus 100, in response to the test signals, generates a ROM clock signal and a test control signal containing a ROM address in step 250. As described above, if the test clock signal (TEST_CLK) has the same frequency as the operation frequency of the on-chip ROM, the on-chip ROM test apparatus 100 does not need to generate a separate ROM clock signal and can use the test clock signal (TEST_CLK) as the ROM clock signal.

After step 250, the on-chip ROM test apparatus 100 compares ROM data read from the ROM 50 corresponding to the ROM address with the reference data (RF_DATA) shown in FIG. 2 so as to determine whether or not an error exists in the ROM data, in step 255.

After step 255, if the comparison of ROM data with the reference data (RF_DATA) is performed to the last ROM address, the on-chip ROM test apparatus 100 externally outputs a test result (TEST_ERR) indicating whether an error exists in the ROM data, in step 260. At this time, the on-chip ROM test apparatus 100 can store the ROM address of a location where an error occurred as the result of comparison of the ROM data with the reference data in step 265. If the comparison of ROM data with the reference data (RF_DATA) is performed to the last ROM address, the on-chip ROM test apparatus 100 externally outputs information as to whether an error occurred and, if an error occurred, the ROM address where the error occurred, as the test result (TEST_ERR), in step 270.

Thus, according to the on-chip ROM test apparatus and method of the present invention, the on-chip ROM test apparatus is embedded within a semiconductor chip having a ROM unit and only minimal information related to whether an error exists in the ROM data is externally provided as the test result. In this manner, possible revealing of ROM data stored in the ROM can be prevented. Also, information related to the ROM address where an error exists can be provided together with a test result and by transferring the ROM address information back to the manufacturing process, the product yield can be improved.

Figure 4:
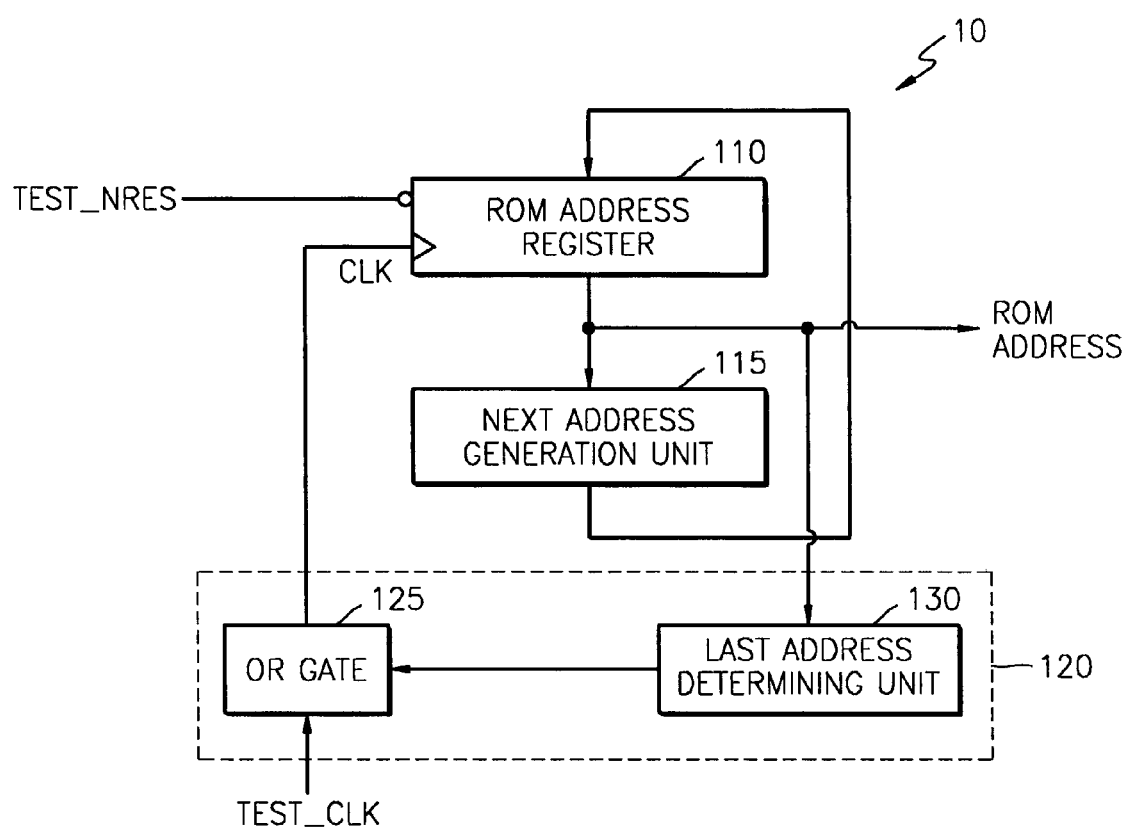
FIG. 4 is a block diagram of a preferred embodiment according to the present invention, of the test control signal generation unit shown in FIG. 1.

FIG. 4 is a block diagram of a preferred embodiment according to the present invention, of the test control signal generation unit shown in FIG. 1. The test control signal generation unit 10 according to the present invention comprises a ROM address register 110, a next address generation unit 115, and an address control unit 120.

Referring to FIG. 4, the ROM address register 110, in response to the test reset signal (TEST_NRES), is initialized to an initial ROM address, and in response to a clock signal generated in the address control unit 120, latches a next ROM address which is input to the ROM address register 110, as a ROM address. By increasing/decreasing the value of the ROM address latched in the ROM address register 110, the next address generation unit 115 generates a next ROM address and provides the generated next ROM address to the ROM address register 110. For example, if the initial ROM address of the ROM address register 110 is the maximum value of the ROM addresses, the ROM address register 110 decreases the value of the ROM address by 1 so as to generate a next address. Meanwhile, if the initial ROM of the ROM address register 110 is the minimum value of the ROM addresses, the ROM address register 110 increases the value of the ROM address by 1 so as to generate a next address.

The address control unit 120 receives a test clock signal (TEST_CLK) and a ROM address signal, and if the ROM address output from the ROM address register 110 is the last ROM address, generates a clock signal (CLK) which controls the ROM address register 110 so that the last ROM address is continuously latched. Preferably, the address control unit 120 is constructed comprising an OR gate 125 and a last address determining unit 130.

The last address determining unit 130 receives the ROM address output from the ROM address register 110, determines whether or not the ROM address is the last ROM address, and if it is determined that the ROM address is the last ROM address, outputs a control signal at a "high" logic level, and otherwise outputs a control signal at a "low" logic level.

The OR gate 125 performs an OR operation on the control signal output from the last address determining unit 130 and the test clock signal (TEST_CLK). If the control signal is in a "low" logic level, the OR gate 125 outputs the test clock signal (TEST_CLK) as is, and if the control signal is in a "high" logic level, outputs a clock signal (CLK) set to a "high" logic level.

Figure 5:
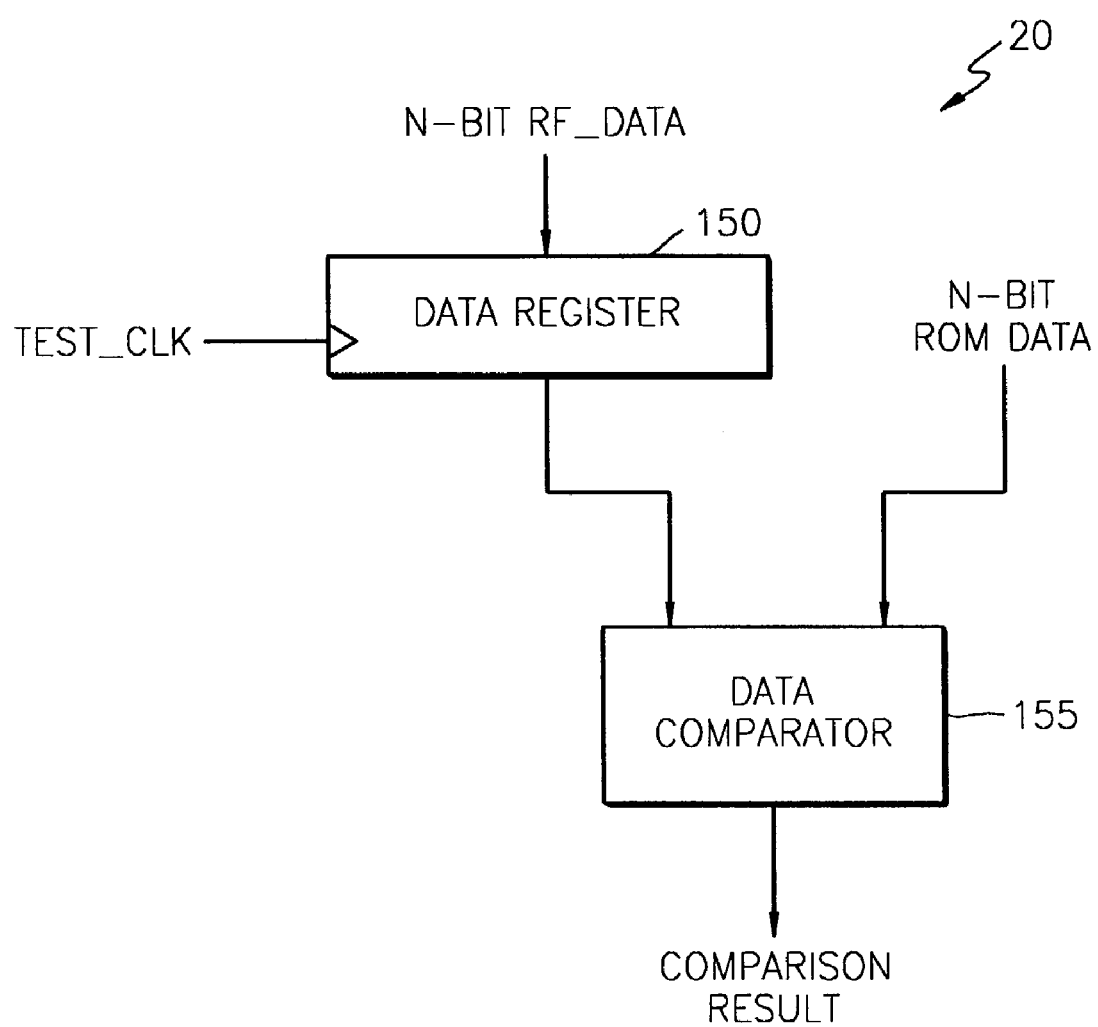
FIG. 5 is a block diagram of a preferred embodiment according to the present invention, of the comparator shown in FIG. 1.

FIG. 5 is a block diagram of a preferred embodiment according to the present invention, of the comparator 20 shown in FIG. 1. The comparator 20 according to the present invention comprises a data register 150 and a data comparator 155.

Referring to FIG. 5, the data register 150 in response to the test clock signal (TEST_CLK) latches N-bit reference data (RF_DATA) which is input from an external source. The N-bit reference data (RF_DATA) may be input in parallel or serial form from the external source.

The data comparator 155 compares the N-bit reference data latched in the data register 150 (RF_DATA) with N-bit ROM data read from the ROM 50 corresponding to the ROM address to determine whether or not they are the same, and outputs the result to the test result accumulator 30. Here, the comparison result of the reference data (RF_DATA) and ROM data corresponding to one ROM address is expressed by one bit. For example, if the reference data (RF_DATA) and the ROM data are the same (if there is no error in the ROM data), the comparison result bit is set to 0, and if the reference data (RF_DATA) and the ROM data are not the same (if there is an error in the ROM data), the comparison result bit is set to 1. The test result accumulator 30 confirms the comparison result bit so as to determine whether or not an error exists in the ROM data.

Figure 6:
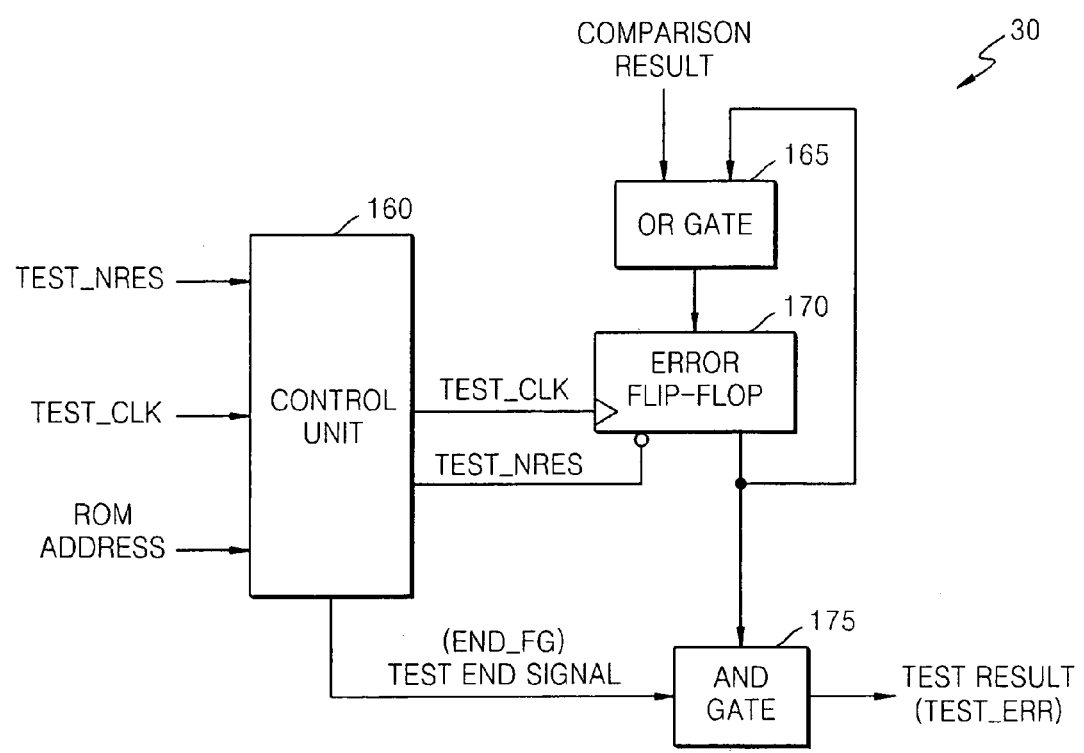
FIG. 6 is a block diagram of a preferred embodiment according to the present invention, of the test result accumulator shown in FIG. 1.

FIG. 6 is a block diagram of a preferred embodiment according to the present invention, of the test result accumulator 30 shown in FIG. 1. The test result accumulator 30 according to the present invention comprises a control unit 160, an OR gate 165, an error flip-flop 170, and an AND gate 175.

Referring to FIG. 6, the OR gate 165 performs an OR operation with the comparison result output from the comparator 20 and a flip-flop output signal which is output from the error flip-flop 170.

The error flip-flop 170 is reset in response to the test reset signal (TEST_NRES), and, in response to the test clock signal (TEST_CLK), latches the output signal of the OR gate 165 and generates the signal as the output signal of the flip-flop. When a comparison result of 1 indicates that an error occurred, because of the OR gate 165 performing an OR operation with the output of the error flip-flop 170, the error flip-flop 170 latches 1 to indicate that there is an error in the ROM data. That is, if at least one error is detected in the ROM data, the error flip-flop 170 latches a signal at a "high(1)" logic level, and if an error is not detected, latches a signal at a "low(0)" logic level.

The control unit 160 receives a ROM address from the test control signal generator 10, recognizes the last ROM address, and if the last ROM address is recognized, generates a test end signal which is enabled at a "high" logic level.

The AND gate 175 performs an AND operation with the test end signal (END_FG) and the flip-flop output signal, and outputs the result signal as a test result (TEST_ERR). That is, the AND gate 175 outputs a "low" logic level signal before the test end signal (END_FG) is enabled. However, after the test end signal (END_FG) is enabled, if the flip-flop output signal indicates that an error in the ROM data is detected, the AND gate 175 outputs a signal at a "high" logic level, or else outputs a signal at a "low" logic level.

As described above, the test result accumulator 30 shown in FIG. 6 generates a signal as to whether an error exists in the ROM data.

Figure 7:
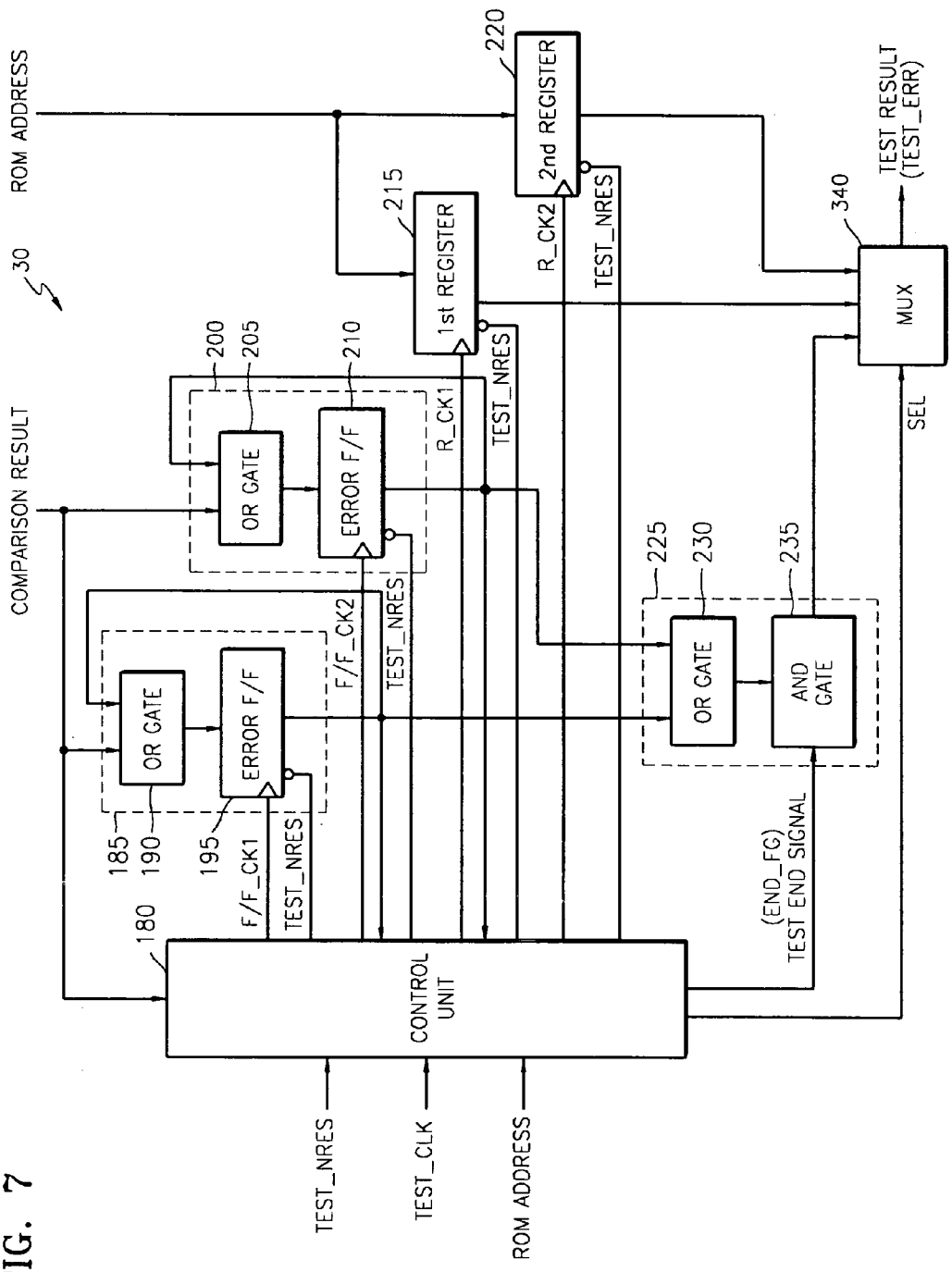
FIG. 7 is a block diagram of another preferred embodiment according to the present invention, of the test result accumulator shown in FIG. 1.

FIG. 7 is a block diagram of another preferred embodiment according to the present invention, of the test result accumulator 30 shown in FIG. 1. The test result accumulator of the preferred embodiment according to the present invention comprises a control unit 180, a first error detection unit 185, a second error detection unit 200, a first register 215, a second register 220, a selector 340, and a logic combination unit 225. FIG. 6 shows the test result accumulator 30 which includes a location where an error occurred in the ROM data, that is, a ROM address, in the test result (TEST_ERR). Meanwhile, for convenience of description, FIG. 7 shows the case where ROM address information containing up to 2 address locations where errors are present is provided.

Referring to FIG. 7, the control unit 180 recognizes the last ROM address by referring to the ROM address, and if the last ROM address is recognized, generates a test end signal (END_FG). Also, the control unit 180 recognizes the frequency of error occurrences from the comparison result, and according to the recognized result, generates the first and second flip-flop clock signals (F/F_CK1, F/F_CK2). As described above, when the comparison bit of 0 indicates that there is no error and the comparison bit of 1 indicates that an error occurred in the ROM data, the control unit 180 recognizes the frequency of error occurrence by counting the frequency of 1's in the comparison result data.

Also, the control unit 180 in response to the output signals of the first and second error detection units 185 and 200 generates first and second register clock signals (R_CK1, R_CK2). Here, before a first error is detected from the comparison result, the control unit 180 generates only the first flip-flop clock signal (F/F_CK1), and if the first error is detected, generates the second flip-flop clock signal (F/F_CK2). Accordingly, if the first error is detected, the control unit 180 controls operation so that the second error detection unit 200 operates. In addition, the control unit 180 logically combines the test clock signal (TEST_CLK) and the output of the first error detection unit 185 and generates the first register clock signal (R_CK1) so that the first register 215 can store the ROM address when the first error is detected. The control unit 180 also logically combines the test clock signal (TEST_CLK) and the output of the second error detection unit 200 and generates the second register clock signal (R_CK2) so that the second register 220 can store the ROM address when the second error is detected. Meanwhile, though for convenience of explanation FIG. 7 shows the test result accumulator that can store two ROM addresses where errors occurred, the test result accumulator may be designed to store more than 2 addresses by extending the circuit to include additional error detectors 200 and registers 220.

Meanwhile, the control unit 180 controls information related to those addresses where errors occurred, while not making such data available externally, by deleting the contents of ROM addresses stored in the register if the frequency of 1's in the comparison result data exceeds a predetermined number. Generally, the number of errors occurring in an on-chip ROM is on the order of 1 to 3. Accordingly, if the number of errors is greater than, for example, 3, then it can be determined that arbitrary reference data (RF_DATA) is being intentionally provided from the external source in order to subversively obtain the contents of the ROM data. If a person performs a test repeatedly using the information on a ROM address where an error occurred, the person may ultimately obtain the contents programmed in the on-chip ROM. Accordingly, the control unit 180 deletes address information stored in the ROM address register when errors occurred more than a predetermined number of times so that accidental leakage of ROM data is avoided.

The first and second error detection units 185 and 200 are reset, respectively, in response to the reset signal (TEST_NRES). The first and second error detection units 185 and 200 receive the comparison result from the comparator 20, and latch the input comparison result in response to the first and second flip-flop clock signals (F/F_CK1, F/F_CK2), respectively. More specifically, according to the control of the control unit 180, the first flip-flop clock signal (F/F_CK1) which is input to the first error detection unit 185 is the same as the test clock signal (TEST_CLK), and if the first error is detected, the second flip-flop clock signal (F/F_CK2) which is input to the second error detection unit 200 is locked as the test clock signal (TEST_CLK). If there is a third error detection unit (not shown) and if the second error is detected, the control unit 180 generates a third flip-flop clock signal that is locked as the test clock signal (TEST_CLK), and the third error detection unit in response to the third flip-flop clock signal can latch the comparison result. In this manner, the test result accumulator can be extended to have n error detectors. Preferably, each of the first and second error detection units 185 and 200 comprises an OR gate 190 and 205 and an error flip-flop 195 and 210.

The OR gate 190 performs an OR operation with the comparison result output from the comparator 20 and the output signal of the error flip-flop 195, and the OR gate 205 performs an OR operation with the comparison result and the output signal of the error flip-flop 210.

The error flip-flop 195 is reset in response to the test reset signal (TEST_NRES), and latches the output signal of the OR gate 190 in response to the first flip-flop clock signal (F/F_CK1). The error flip-flop 210 is reset in response to the test reset signal (TEST_NRES), and latches the output signal of the OR gate 205 in response to the second flip-flop clock signal (F/F_CK2) that is generated when the first error is detected in the comparison result. If the comparison result of 1 indicates that an error occurred in the ROM data, because of the OR gate 190 which performs an OR operation with the output of the error flip-flop 195, the error flip-flop 195 latches 1 at the time when the first error occurs in the comparison result. Also, because of the OR gate 205, which performs an OR operation with the output of the error flip-flop 210, the error flip-flop 210 latches 1 from the time that the second error occurs in the comparison result. That is, the error flip-flop 195 latches a signal to a "high(1)" logic level if the first error is detected in the ROM data, and the error flip-flop 210 latches a signal to a "high(1)" logic level if the second error is detected in the ROM data.

Next, the first register 215 is reset in response to the test reset signal (TEST_NRES) and in response to the first register clock signal (R_CK1) stores a ROM address where the first error occurred. The second register 220 is reset in response to the test reset signal (TEST_NRES) and in response to the second register clock signal (R_CK2) stores a ROM address where the second error occurred.

The logic combination unit 225, in response to the test end signal (END_FG), generates an error detection signal which is enabled if any one of the output signals of the first and second error detection units 185 and 200 is enabled. Preferably, the logic combination unit 225 comprises an OR gate 230 and an AND gate 235. The OR gate 230 performs an OR operation with the output signals of the first and second error detection units 185 and 200. Accordingly, the OR gate outputs a signal which is enabled at a "high" logic level if at least one error is detected in the comparison result. The AND gate 235 performs an AND operation with the test end signal (END_FG) and the output signal of the OR gate 230 and outputs the result signal as an error detection signal.

A selector 340 in response to the selection signal (SEL) output from the control unit 180 selectively outputs any one of the error detection signals, and ROM addresses latched by the first and second registers 215 and 220. That is, the control unit 180 controls the selector 340 by using the selection signal (SEL) so that information on the occurrence of errors and information on ROM addresses where errors occurred can be sequentially output through a single output terminal. At this time, the first and second registers 215 and 220 output the stored ROM address information as serial data so that the ROM address information can be output through a single output terminal.

The present invention may be embodied in code, which can be read by a computer, on a computer readable recording medium. The computer readable recording medium includes all kinds of recording apparatuses on which computer readable data are stored.

The computer readable recording media includes storage media such as magnetic storage media (e.g., ROM's, floppy disks, hard disks, etc.) and optically readable media (e.g., CD-ROMs, DVDs, etc.). Also, the computer readable recording media can be stored on multiple computer systems that are connected to each other through a network, such that the computer readable recording media is stored and executed as a computer readable code between the multiple computer systems in a distributed mode.

Preferred embodiments have been explained above and are shown. However, the present invention is not limited to the preferred embodiment described above, and it is apparent that variations and modifications by those skilled in the art can be effected within the spirit and scope of the present invention defined in the appended claims. Therefore, the scope of the present invention is not determined by the above description but rather by the accompanying claims.

According to the present invention as described above, by constructing the on-chip ROM test apparatus in a semiconductor chip and externally providing only minimum information as to whether or not an error exists as a result of a test of an on-chip ROM, the possible leakage of ROM data stored in the ROM can be prevented. Also, according to the apparatus and method of the present invention, information related to the ROM address at which an error occurred can be provided together as a test result and by feeding the ROM address information back to the manufacturing process, product yield can be increased.

What is claimed is:

1. An on-chip ROM test apparatus which internally tests a ROM integrated into a semiconductor chip, the on-chip ROM test apparatus comprising:
   a test control signal generator which, in a test operation, generates a ROM clock signal to operate the ROM and test control signals including a ROM address to access the ROM using external test signals, the test signals including a test mode signal that sets an operational mode of the ROM to a test mode, a test clock signal which generates a clock for testing the ROM, and a test reset signal for initialization;
   a comparator which compares ROM data that is preprogrammed in the ROM prior to the test operation, and read from the ROM in response to the ROM address with external reference data received by the comparator having a same number of bits as the ROM data, and outputs a comparison result; and
   a test result accumulator which, in response to the comparison result of the comparator, stores information related to whether an error is present in the RQM data, as a test result, and externally outputs the test result.

2. The on-chip ROM test apparatus of claim 1 wherein the test result is externally output if the comparison of the ROM data is performed to a ROM address that is the last ROM address.

3. The on-chip ROM test apparatus of claim 1, wherein the test result accumulator receives the ROM address from the test control signal generator, and, if it is determined from the comparison result that an error is present, stores the ROM address associated with the error, and externally outputs information related to whether the error occurred and information related to the ROM address where the error occurred as the test result.

4. The on-chip ROM test apparatus of claim 1, wherein the test control signal generator comprises:
   a ROM address register which, in response to the test reset signal, is initialized with an initial ROM address and in response to a clock signal, latches as an input a next ROM address as the ROM address;
   a next address generation unit which generates the next ROM address by increasing or decreasing the value of the ROM address latched in the ROM address register, and provides the next ROM address to the ROM address register; and
   an address control unit which receives the test clock signal and the ROM address, and if the ROM address is the last ROM address, controls the clock signal which is output to the ROM address register to control the latching of the last ROM address.

5. The on-chip ROM test apparatus of claim 4, wherein the address control unit comprises:
   a last address determining unit which receives the ROM address latched in the ROM address register, determines whether the ROM address is the last ROM address, and if it is determined that the ROM address is the last ROM address, outputs a control signal at a first logic level, and, if it is determined that the ROM address is not the last ROM address, outputs the control signal at a second logic level that is complementary to the first logic level; and
   a logic combination unit which performs a logic combination operation with the control signal and the test clock signal, and if the control signal is at the second logic level, outputs the test clock signal as the clock signal, and if the control signal is at the first logic level, outputs the clock signal which is set.

6. The on-chip ROM test apparatus of claim 1, wherein the comparator comprises:
   a data register which, in response to the test clock signal, latches N-bit reference data; and
   a data comparator which compares the data latched in the data register with the N-bit ROM data read from the ROM corresponding to the ROM address to determine whether the data are the same.

7. The on-chip ROM test apparatus of claim 1, wherein the test result accumulator comprises:
   a first OR unit which performs an OR operation on a comparison result output from the comparator and a flip-flop output signal;
   a first error flip-flop unit which, in response to the test reset signal, is reset, and which, in response to the test clock signal, latches the output signal of the first OR unit and generates the flip-flop output signal;
   a control unit which, referring to the ROM address, recognizes the last ROM address and generates a test end signal that is enabled if the last ROM address is recognized; and
   a first AND unit which performs an AND operation with the test end signal and the flip-flop output signal, and outputs the result of the AND operation as a test result.

8. The on-chip ROM test apparatus of claim 1, wherein the test result accumulator comprises:
   a plurality of error detection units which are reset in response to the test reset signal, each receiving the comparison result, and in response to a plurality of flip-flop clock signals corresponding to the plurality of error detection units, each generating flip-flop output signals which are enabled in response to respective frequencies of error occurrences based on the comparison result;

a plurality of registers which are reset in response to the test reset signal, and latch input ROM addresses in response to a plurality of register clock signals corresponding to the plurality of registers, respectively;

a control unit which receives the ROM address, recognizes the last ROM address, generates a test end signal that is enabled if the last ROM address is recognized, recognizes the frequency of error occurrences from the comparison result, generates the plurality of flip-flop clock signals according to the recognized result, and generates the plurality of register clock signals that are controlled in response to the plurality of flip-flop output signals; and a logic combination unit which in response to the test end signal generates a test result signal that is enabled if any one of the plurality of flip-flop output signals is enabled.

9. The on-chip ROM test apparatus of claim 8, wherein each of the plurality of register outputs a latched ROM address as serial data.

10. The on-chip ROM test apparatus of claim 8, wherein the control unit deletes ROM address information stored in the plurality of registers if the frequency of error occurrences is equal to or greater than a predetermined frequency.

11. The on-chip ROM test apparatus of claim 8, wherein each of the plurality of error detection units comprises:

a second OR unit which performs an OR operation of the comparison result output from the comparator with the flip-flop output signal corresponding to the error detection unit; and a second error flip-flop unit which is reset in response to the test reset signal, latches the output signal of the OR unit in response to the flip-flop clock signal, and generates the latched signal as the flip-flop output signal.

12. The on-chip ROM test apparatus of claim 8, wherein the logic combination unit comprises:

a third OR unit which performs an OR operation of the plurality of flip-flop output signals; and a second AND unit which performs an AND operation of the test end signal and the output signal of the third OR unit and outputs the result of the AND operation as a test result signal.

13. The on-chip ROM test apparatus of claim 8, further comprising:

a selector which outputs sequentially the test result signal, and the ROM addresses latched by the plurality of registers under control of the control unit.

14. An on-chip ROM test method for internal test of a ROM integrated into a semiconductor chip, the on-chip ROM test method comprising:

(a) in response to external test signals, generating in a test operation a ROM clock signal to operate the ROM and test control signals including a ROM address to access the ROM;

(b) comparing ROM data that is preprogrammed in the ROM prior to the test operation, and read from the ROM in response to the ROM address with external reference data having a same number of bits as the ROM data, and detecting the occurrence of an error in the ROM data; and (c) if the comparison of the ROM data is performed to a last ROM address in step (b), externally outputting information related to whether at least one error occurred in the ROM data, as a test result.

15. The on-chip ROM test method of claim 14, further comprising:

storing the ROM address of the ROM data where an error occurred if the occurrence of the error is detected in step (b), wherein the stored ROM address is included in the test result and externally output.

16. The on-chip ROM test method of claim 14, wherein step (a) comprises:

(a1) in response to a clock signal, generating the ROM address;

(a2) determining whether the ROM address is the last ROM address; and (a3) if it is determined in step (a2) that the ROM address is the last ROM address, controlling the clock signal so that the last ROM address is maintained without generating a next ROM address in step (a1).

17. The on-chip ROM test method of claim 14, wherein step (b) comprises:

(b1) in response to the test clock signal, latching N-bit reference data which is input from an external source; and (b2) comparing the reference data latched in step (b1) with N-bit ROM data read from the ROM corresponding to the ROM address.

18. The on-chip ROM test method of claim 14, wherein step (c) comprises:

(c1) based on the comparison result of step (b), determining whether an error occurred in at least one of the ROM data;

(c2) if it is determined in step (b) that an error occurred in at least one ROM data, enabling an error detection signal; and (c3) if the last ROM address is recognized, externally providing the enabled error detection signal as a test result.

19. The on-chip ROM test method of claim 14, wherein step (c) comprises:

(c11) in response to a test clock signal, receiving the comparison result and the ROM address, respectively;

(c12) in response to the comparison result, detecting the occurrence of an error in ROM data, and storing a ROM address corresponding to the location where the error occurred; and (c13) in response to the ROM address, if the last ROM address is recognized, externally providing an error detection signal which indicates whether an error is detected, and a ROM address corresponding to the location where the error occurred, as a test result.

20. The on-chip ROM test method of claim 19, further comprising:

recognizing the frequency of error occurrences by referring to the comparison result; and if the frequency of error occurrences is greater than a predetermined frequency, deleting the ROM address stored in step (c12) and preventing the external output of ROM address information.

21. The on-chip ROM test method of claim 19, wherein in step (c12) the error detection signal refers to the comparison result and if an error occurred in at least one ROM data item, the error detection signal is enabled.

22. The on-chip ROM test method of claim 19, wherein the ROM address is externally provided as serial data.

23. A semiconductor apparatus comprising:

a ROM in which ROM data is preprogrammed;

a ROM control unit which generates a ROM control signal to control the ROM during a normal mode of operation;

a ROM test apparatus which, in a test operation, generates a ROM clock signal to operate the ROM and test control signals including a ROM address to access the ROM by using external test signals, the external test signals including a test mode signal that sets the mode of the ROM to a test mode, the ROM test apparatus for performing a test to determine whether an error exists in the ROM data by comparing ROM data that is preprogrammed in the ROM prior to the test operation and read from the ROM in response to the ROM address with external reference data, received by the ROM test apparatus having a same number of bits as the ROM data; and a selector which, in response to the test mode signal, selectively provides one of the ROM control signal and the test control signal to the ROM.

24. The semiconductor apparatus of claim 23, wherein the ROM test apparatus comprises:

a test control signal generator which, using the test signals, generates a ROM clock signal to operate the ROM and test control signals including a ROM address to access the ROM;

a comparator which compares the ROM data read from the ROM in response to the ROM address with the external reference data; and a test result accumulator which, referring to the comparison result from the comparator, stores information related to whether an error exists, as a test result, and if the comparison of the ROM data is performed to the last ROM address, externally outputs the test result.

25. The semiconductor apparatus of claim 24, wherein the test result accumulator receives the ROM address from the test control signal generator, and if it is determined from the comparison result that an error occurred, stores the ROM address where the error occurred, and externally outputs information related to whether an error occurred and information on the ROM address where the error occurred, as the test result.

26. The semiconductor apparatus of claim 25, wherein the test result accumulator sequentially outputs the error detection signal and the ROM address where the error occurred, as serial data.

27. The semiconductor apparatus of claim 23 wherein the external test signals further include a test clock signal which generates a clock used in testing the ROM, and a test reset signal for initialization.

* * * * *

UNITED STATES PATENT AND TRADEMARK OFFICE
CERTIFICATE OF CORRECTION

PATENT NO. : 7,134,063 B2
APPLICATION NO. : 10/460284
DATED : November 7, 2006
INVENTOR(S) : Sang-yeun Cho et al.

It is certified that error appears in the above-identified patent and that said Letters Patent is hereby corrected as shown below:

Column 9, line 57, delete "RQM" and insert --ROM--.

Column 13, line 14, after "operation" insert --,--.

Signed and Sealed this

Sixth Day of March, 2007

JON W. DUDAS
*Director of the United States Patent and Trademark Office*